United States Patent [19]

Bower

[11] Patent Number: 4,579,812

[45] Date of Patent: Apr. 1, 1986

[54] PROCESS FOR FORMING SLOTS OF DIFFERENT TYPES IN SELF-ALIGNED RELATIONSHIP USING A LATENT IMAGE MASK

[75] Inventor: Robert W. Bower, Los Gatos, Calif.

[73] Assignee: Advanced Micro Devices, Inc., Sunnyvale, Calif.

[21] Appl. No.: 576,658

[22] Filed: Feb. 3, 1984

[51] Int. Cl.[4] .................. G03C 5/00; H01L 21/306
[52] U.S. Cl. .................. 430/313; 430/314; 430/315; 430/316; 430/317; 430/323; 430/324; 430/394; 156/648; 156/650; 156/657.1; 156/662
[58] Field of Search .............. 430/312, 313, 314, 316, 430/394, 323, 317; 156/650, 659.1, 662, 648

[56] References Cited

U.S. PATENT DOCUMENTS 3,542,551 11/1970 Rice ................................. 430/312

OTHER PUBLICATIONS

Betz et al., "Self-Aligned Contact Holes", IBM Technical Disclosure Bulletin, v. 24, No. 9, Feb. 1982, pp. 4643–4644.
Magdo et al., "Self-Aligned ROI to SAM Structure", IBM Technical Disclosure Bull., vol. 24, No. 10, Mar. 1982, pp. 5115–5118.
Malaviya, "Self-Aligned Deep Trench Isolation for Bipolar Transistors", IBM Tech. Disclosure Bull., vol. 25(5), Oct. 1982, pp. 2292–2293.
Ephrath, "Reactive Ion Etching for VLSI", IEEE Transactions on Electron Devices, v. ED-28(11), Nov. 1981, p. 1315–1319.
Wang et al., "Reactive-Ion Etching Eases Restrictions on Materials and Feature Sizes", Electronics, Nov. 1983, pp. 157–161.
Kendall, "Vertical Etching of Silicon at Very High Aspect Ratios", Annual Review of Material Science, vol. 9, 1979, pp. 373–403.
Minegishi et al., "A Submicron CMOS Megabit Level Dynamic RAM Technology Using a DFTC Cell", Proceedings IEDM, 1983, pp. 319–322.

Primary Examiner—John E. Kittle
Assistant Examiner—José G. Dees
Attorney, Agent, or Firm—Patrick T. King; J. Vincent Tortolano

[57] ABSTRACT

Slots of different types are fabricated using a single latent image mask. The slots of different types are thus located with respect to each other in a self-aligned relationship. In one embodiment an oxide of the semiconductor material, e.g., silicon dioxide, is used as a unitary masking layer. The slots of various types are defined in the mask and are fabricated in succession by relying on a universal etch and differential thicknesses for the oxide layers over slots of the different types. When the slots are formed they are filled with a suitable material. In another embodiment at least a dual layer latent image mask is used in which the two materials have different etch properties. One layer is used as a stop etch layer during fabrication of one of the slot types.

24 Claims, 20 Drawing Figures

PROCESS FOR FORMING SLOTS OF DIFFERENT TYPES IN SELF-ALIGNED RELATIONSHIP USING A LATENT IMAGE MASK

BACKGROUND OF THE INVENTION

1. Field of the Invention

This invention relates to a process for fabricating slots of different types in a semiconductor material and, more particularly, relates to a process for fabricating slots of different types in self-aligned relationship

2. Discussion of Background and Prior Art

As the densities of integrated circuits increase, there has been a trend in isolation technology to use trench or slot formation processes for form physical gaps between active regions in lieu of the more conventional pn junction and local-oxidation (LOCOS TM) structures. See, e.g., D. N. K. Wang et al, "Reactive-Ion Etching Eases Restrictions on Materials and Feature Sizes", *Electronics*, Nov. 3, 1983, pp. 157, 159. This trend does not result from the availability of anisotropic etches which produce narrow, deep slots in silicon since these etches do not readily form arbitrary shapes or small feature sizes. See, e.g., D. L. Kendall, "Vertical Etching of Silicon at Very High Aspect Ratios", *Annual Review of Material Science*, 1979, v. 9, pp. 373–403. The trend results primarily from the availability of physical etching equipment such as plasma etchers or equipment which uses both physical and wet chemical processes such as reactive ion etch equipment. In theory, such equipment employing physical etching mechanisms can etch holes and features of arbitrary shape, e.g., shapes of any type that may be defined in masks of the type employed in semiconductor fabrication.

In addition to the formation of slots in semiconductor wafers for isolating individual devices, slots are also being considered for use as active elements. For example, a slot may be filled with appropriate materials so that it functions as a capacitor, see, e.g. K. Minegishi et al, "A Submicron CMOS Megabit Level Dynamic RAM Technology Using a Doped Face Trench Capacitor Cell", *Proceedings IEDM* 1983, p. 319. Ultimately it is desired that slots of various types and shapes may be fabricated on the same integrated circuit. For example, an array of isolation slots may be intermixed with an array of active element slots. Or an array of one type of isolation slot may be intermixed with an array of another type of isolation slot. In either case, since many of the same process steps will be used for forming both types of slots even though the end use or specifications are different, it would be desirable to use the same mask for each type of slot, preferably in self-aligned fashion. The desirability of self-aligned processes and the various techniques for achieving self-alignment have been well developed in the semiconductor processing art. See, e.g., I. E. Magdo et al, "Self-Aligned ROI to SAM Structure", *IBM Technical Disclosure Bull.*, v. 24, No. 10, pp. 5115–18, March 1982; and P. W. Betz et al, "Self-Aligned Contact Holes", *IBM Technical Disclosure Bull.*, v. 24, No. 9, pp. 4643–4, February 1982. In S. D. Malaviya, "Self-Aligned Deep Trench Isolation for Bipolar Transistors", *IBM Technical Disclosure Bull.*, v. 25, No. 5, pp. 2292–3, October 1982 a process is shown for fabricating slots or trenches which are self-aligned to adjacent active areas. There is no disclosure of multiple types of slots or of self-alignment between slots.

In order to use a single mask for forming different circuit features it is known to use selective etches. The use of a single mask for forming different circuit features is becoming more common due to the increasing complexity of devices. For example, when integrated circuits were based on simpler structures one could use separate mask sets for most of the layers in sequence. However, as structures have become progressively more complex it has become necessary to use other means in addition to separate masks to produce structural features. Separate masks and the associated processing steps reduce yield and add to the cost of processing and are therefore to be avoided, if possible. One of these additional means has been the aforementioned use of selective etching. By selective etching is meant an etch which etches one material preferentially to another material. Various etches which have selective etching properties with respect to the several semiconductor materials, e.g., silicon nitride, silicon dioxide, silicon, aluminum alloys, etc., are known in the art. See, e.g., D. N. K. Wang et al, "Reactive-ion etching eases restrictions on materials and feature sizes", *Electronics*, Nov. 3, 1983, p. 157; and L. M. Ephrath, "Reactive Ion Etching for VLSI", *IEEE Transactions on Electron Devices*, v. ED-28, No. 11, November 1981, p. 1315.

BRIEF DESCRIPTION OF THE DRAWINGS

For a more complete understanding of the process for forming slots of the present invention, reference may be had to the accompanying drawings which are incorporated herein by reference and in which:

FIGS. 1a–1k are cross-sections showing a process sequence where silicon dioxide is used as a latent image mask for different types of slots to be formed and in which particularly:

FIGS. 2a–2i are a series of cross-sectional views showing a process utilizing a dual layer mask wherein the layers have differential etch properties;

SUMMARY OF THE INVENTION

Slots of different types are fabricated using a single latent image mask. The slots of different types are thus located with respect to each other in a self-aligned relationship. In one embodiment an oxide of the semiconductor material, e.g. silicon dioxide, is used as a unitary masking layer. The slots of various types are defined as latent images in the mask and are fabricated in succession. The thickness of the oxide over the substrate regions in which slots of a first type are to be formed is different from the thickness of the oxide over the substrate regions where slots of the second type are to be formed so that substrate regions associated with slots of a particular type may be selectively exposed by a universal etch of known etch rate. When the slots are formed they are filled with a suitable material to provide structural integrity for overlying layers. In another embodiment a dual layer latent image mask is used in which the two materials have different etch properties. One layer is used as a stop etch layer during fabrication of one of the slot types.

DESCRIPTION OF THE PREFERRED EMBODIMENTS

The purpose of the process of the present invention is to fabricate slots of various types in self-aligned relationship. The slot type will be determined by the ultimate application, i.e., whether the slot is to be used for purposes of isolation or is to be used as an active element. See, e.g., the co-pending application of R. Bower, "A Bipolar Transistor With Active Elements Formed In Slots", Ser. No. 576,659, filed Feb. 3, 1984. For practicable slot, a near vertical sidewall is desired or at most a sidewall with no more than several degrees of variation from vertical. If concavities, overhangs or bottle-shapes are present then the slots may be imperfectly filled and contain voids which lead to irregular topographies. The depth will vary based on the intended application. For example, for isolation of memory active elements the slot may only need to be 5 microns deep but for isolation of linear bipolar devices a slot may need to be as deep as 70 microns. The widths will vary in accordance with the quality of the lithographic equipment available to fabricate the integrated circuits. Typical widths will be on the order of several microns to one micron.

To obtain self-alignment it is necessary at some point in the process to have all slot types defined as latent images in a single mask. Thus, in the process of the present invention a latent image mask is employed which will harbor the images of all slot types and thereby produce self-alignment for the slot types as they are formed. In a first embodiment a layer of silicon dioxide is used as a single layer latent image mask. This is designated the Oxide Step Process. In another embodiment a dual layer of masking materials is selected from the group of materials such as silicon nitride, silicon dioxide, organic materials, metals, polycrystalline silicon and other metal oxides. In this embodiment one layer serves as the latent image mask to define the slot types to be formed. The other layer serves as a stop etch layer to prevent the etching of a second type of slot while the first type of slot is being etched. This is designated the Differential Etch Stop Process. These two processes will be described in detail subsequently.

Oxide Step Process

Figure 1A:
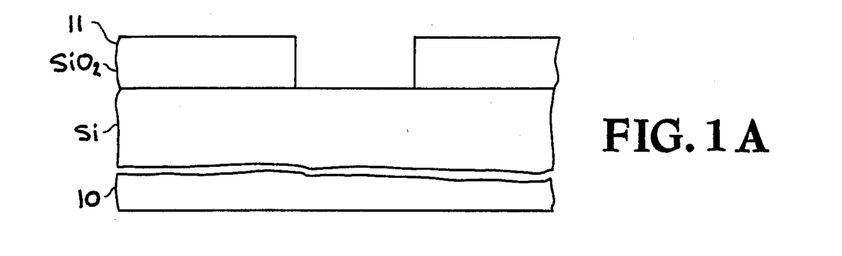
FIG. 1a is a cross-section of a patterned layer of silicon dioxide which exposes a region in which a slot is to be formed.
Figure 1B:
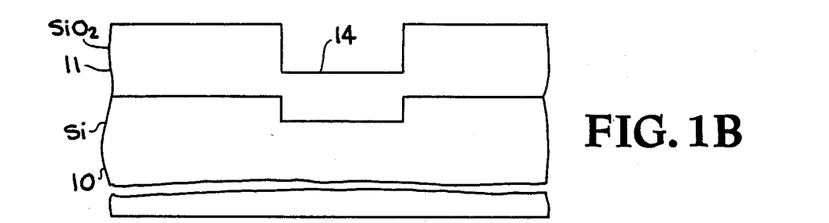
FIG. 1b is a cross-section showing FIG. 1a after additional oxide growth.
Figure 1C:
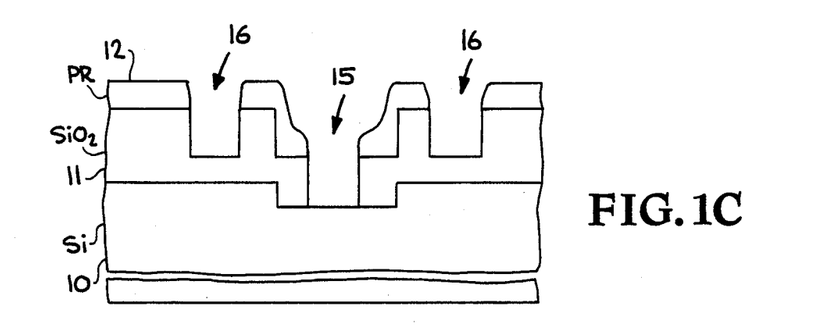
FIG. 1c is a cross-sectional view of FIG. 1b after definition by masking of slot regions to be formed and etching of silicon dioxide until it is fully removed in control region 15.

The oxide step embodiment of the process of the present invention may be seen with reference to FIGS. 1a–1k. For purposes of illustration, the process is shown as implemented in a silicon semiconductor substrate. However, the latent image mask principle applies to any semiconductor system, e.g., to gallium arsenide, indium phosphide, etc. In FIG. 1a a silicon substrate 10 has a layer of silicon dioxide 11 applied thereon. The layer may be masked and opened up by conventional lithographic, masking and etching techniques as well as anisotropic etching techniques. The regions that are opened up will establish the areas where a first type of slot is to be formed. As shown in FIG. 1b additional oxide is grown by conventional thermal techniques. As a consequence, the layer 11 of silicon dioxide over wafer portions 10 is made thicker and a layer 14 forms over step 13. Then, as shown in FIG. 1c, a layer of photoresist 12 is applied over the silicon dioxide layer 11. Photoresist layer 12 is patterned and opened up to allow the etching of silicon dioxide layer 11 to define a slot region 15 of a first type and slot regions 16 of a second type. Since the first type slot in substrate region 15 will be formed first, the silicon oxide is completely removed, i.e., is removed down to the exposed surface of silicon substrate 10. Some thickness of silicon dioxide continues to separate the slot region 16 to be formed from the upper surface of silicon substrate 10. The end point of the etching process is determined either by knowing the thickness and measuring etch rate and time, or by periodically looking at the color of the layer of silicon dioxide in slot 15 until it disappears. It is desirable to have well controlled etch rates so that the oxide in region 15 can be removed without significant overetching in region 16. Alternately, the end point of etching can be detected by conventional means such as mass spectrometry, trace gas analysis or conductivity should such sophisticated means be available. It is the differential thickness of the oxide layers over regions 15 and 16 that distinguishes slots of the first type from slots of the second type and allows them to be fabricated separately with their own unique specifications.

Figure 1D:
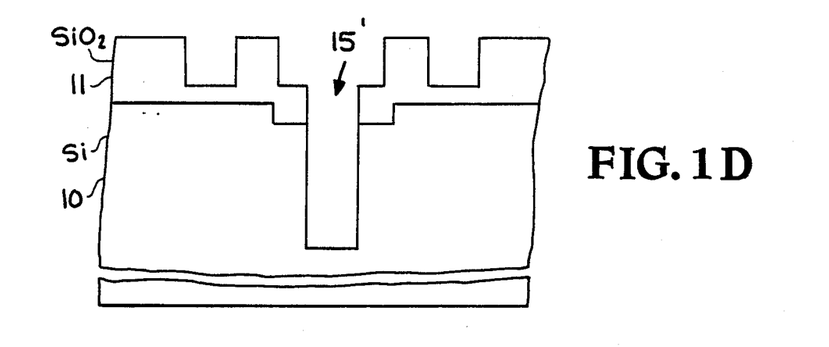
FIG. 1d is a cross-sectional view of FIG. 1c after etching the first type of slot in region 15'.
Figure 1E:
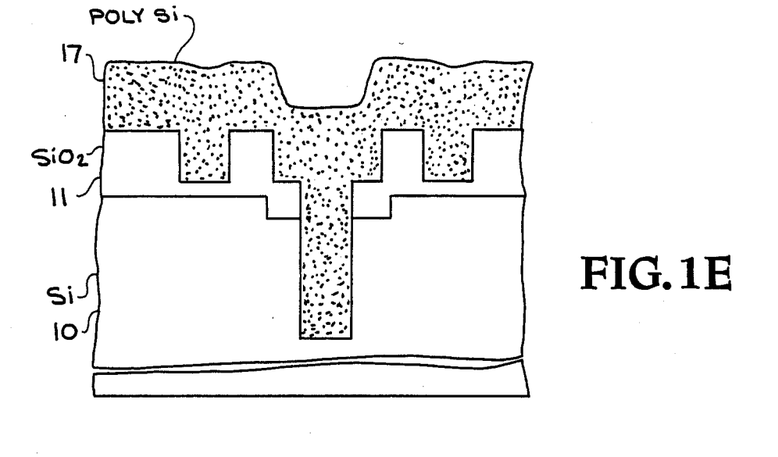
FIG. 1e is a cross-section of FIG. 1d after the first type of slot has been filled.
Figure 1F:
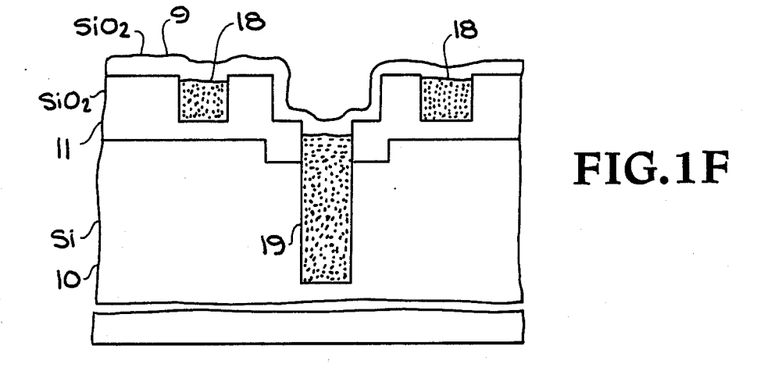
FIG. 1f is a cross-section of FIG. 1e after excess filler material has been removed and a layer of silicon dioxide has been applied.

After exposure of the regions 15 in the substrate where slots of the first type are to be formed, the photoresist layer 12 is stripped and, as shown in FIG. 1d, the first type slot 15' is etched using a conventional silicon etch. The depth will be determined by the length of etch and will be selected in accordance with the intended application, i.e., isolation, separation or formation of active regions, for which slot region 15 is formed. For most device applications it is desired to fill the slot 15' so that it may be etched back and provide an integral planar surface to which overlying layers may be applied. It would be impossible to lay conductive metal lines, for example, over an integrated circuit having open slots. Thus, as shown in FIG. 1f, a suitable filler material is deposited over the integrated circuit thereby filling slot 15' as well as all other depressions on the surface including the openings 16 for the second type slots to be formed subsequently. The filler material is selected from classes of conductive and insulating materials and including such materials as silicon nitride, polycrystalline silicon, metal oxides, silicon, etc. The material must readily flow into the slots and preferably isotropically deposits on the surfaces of the slot. The choice of filler material will be based on desired function (isolation versus active device), the size and shape of the slot and on the prospect of avoiding the use of an additional mask. After application, the filler material is etched back by an isotropic etch such as a fluorinated plasma leaving pockets of filler material 18 in the region 16 of silicon dioxide layer 11 over the second type of slots to be formed and a plug 19 in the first type slot region. Typically, this etchback is one micron or less for a slot that may have a depth of 5 to 70 microns.

Figure 1G:
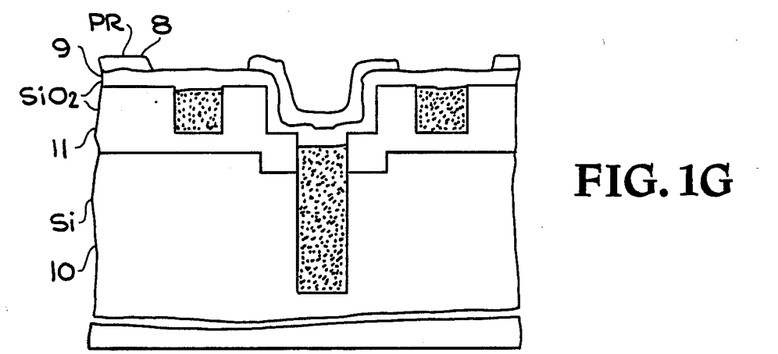
FIG. 1g is a cross-section of FIG. 1f after a layer of photoresist has been applied and patterned to expose with a margin the second type of slot region to be formed.
Figure 1H:
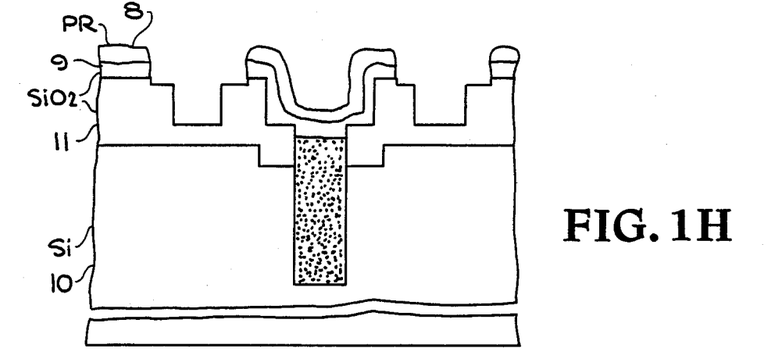
FIG. 1h is a cross-section of FIG. 1g after portions of the overlying silicon dioxide layer have been removed as well as the excess filler material in the second type slot regions to be formed.
Figure 1I:
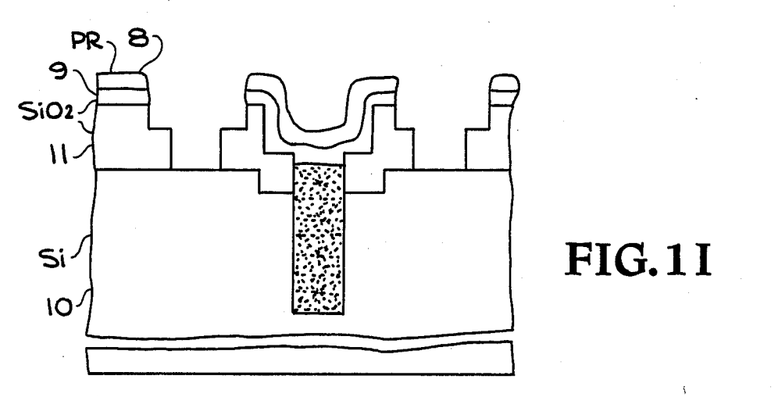
FIG. 1i is a successor cross-section to FIG. 1h after the silicon dioxide above the second slot regions has been fully removed.
Figure 1J:
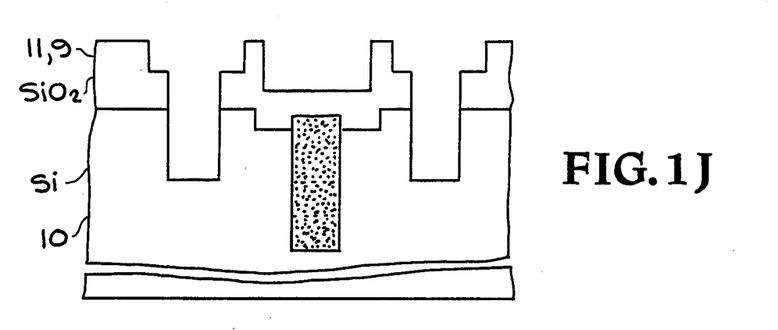
FIG. 1j is a successor cross-section to FIG. 1i after the second type slot regions have been etched in the silicon substrate.
Figure 1K:
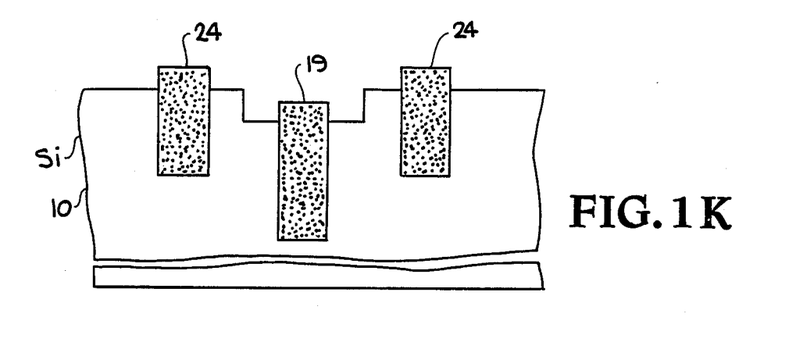
FIG. 1k is a successor cross-section to FIG. 1j after the second type slots have been filled, the excess filler material has been removed and the oxide mask has been stripped.

Since it is desired to selectively etch the pockets 18 of filler material above the second type slot regions to be formed, a layer of silicon dioxide 9 is universally applied over the exposed surface of the integrated circuit in process, as shown in FIG. 1f. Then, a layer of photoresist 8 is applied over silicon dioxide 9 and patterned to expose the regions where second type slots are to be formed. The exposed regions are shown in FIG. 1g to be larger than the slot widths in order to ensure that all filler material is removed. Then, as shown in FIG. 1h, the exposed portions of silicon dioxide layer 9 are etched to expose pockets 18 of filler material. The filler material is etched and a small portion of the upper regions of silicon dioxide layer 11 thereby defining the regions for second type slots will be etched. In FIG. 1i the remaining silicon dioxide has been etched away. And in FIG. 1j the second type slots have been formed. As shown, the slot region of the second type is more shallow than the slot region of the first type. Generally, slots may have varying depths, widths and aspect ratios. Finally, the second type slots are filled with a suitable filler material and the surfaces etched back to expose the plug 19 in the first type slot and plugs 24 in the second type slots. In usual practice, a planar surface will subsequently be produced which will permit the application of overlying layers. The second type filler material could be the same or of different type than the first type filler material and will be chosen in accordance with the desired application. The result of using the unitary latent image mask is that the slots of the first type are arrayed in self-aligned relationship with slots of the second type.

Differential Etch Stop Process

Figure 2A:
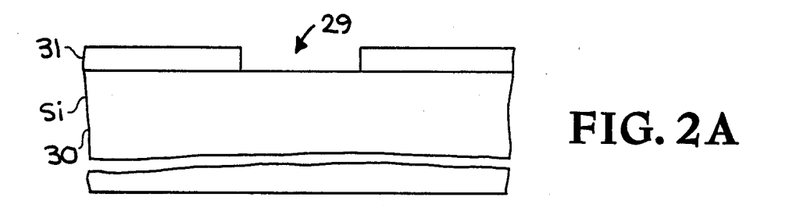
FIG. 2a is a cross-section of a silicon substrate having a first layer of masking material patterned to define a region in which a slot is to be formed.
Figure 2B:
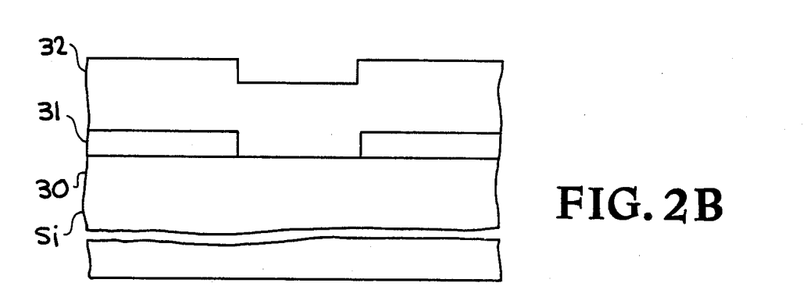
FIG. 2b is a successor cross-section to FIG. 2a in which a second mask layer having an etch property different than the property of said first layer has been applied.
Figure 2C:
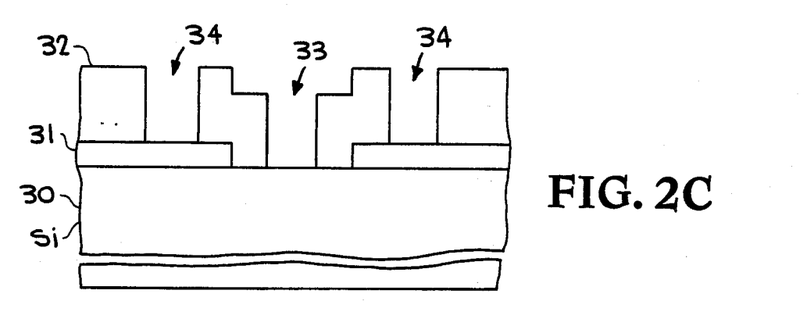
FIG. 2c is a successor cross-section to FIG. 2b in which the second mask layer has been masked and etched to open up a first type slot to be formed and images for second type slots.
Figure 2D:
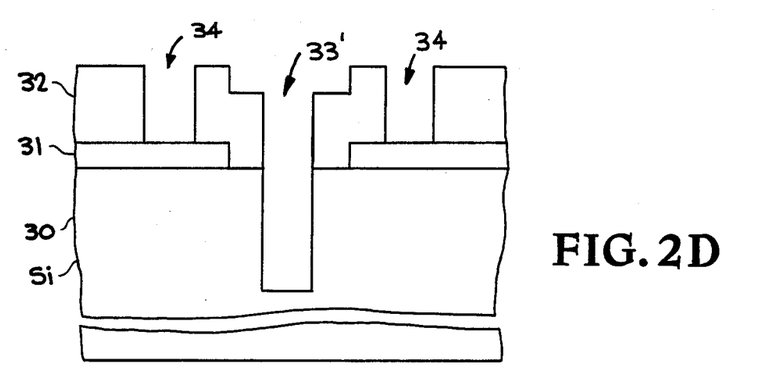
FIG. 2d is a successor cross-section to FIG. 2c after the first type slot has been etched in the silicon substrate.

A process which utilizes selective etching to simplify the process sequence for fabricating slots of different types is shown in FIGS. 2a–2i. Fewer mask steps are required if the inherent etch selectivity of one material with respect to another may be employed in order to selectively fabricate one region in lieu of another region. The material with the lowest etch rate can serve as a stop layer while the other layer is being etched through. Thus, dual layers of masking materials having different etch rates are used to fabricate slots of different types. The latent images can still be produced in one of the layers or can be produced in both of the layers. In the embodiment described in the Figures, the latent images of two types of slots are formed in a single masking layer. In FIG. 2a a semiconductor substrate, described for purposes of illustration herein to be a silicon substrate 30, has a layer of a first masking material 31 applied thereon and patterned. The exposed region 29 defines the location where a slot region of a first type will be formed. The first masking layer 31 is selected from the class of materials which are compatible with the semiconductor substrate and have an etch property which is different from that of a second masking layer to be applied subsequently. Typical materials for layer 31 include silicon nitride, silicon dioxide, organic materials and metals. Thereafter, as shown in FIG. 2b, a layer of a second masking material is applied over the first layer 31 and the exposed regions of silicon substrate 30. Layer 32 will be selected from the same class as layer 31 but will have different etch properties. The differential etch properties of layer 31 with respect to second layer 32 are useful at a later stage in the process to differentiate between slots of the first type and slots of the second type, as shown in FIG. 2d and described subsequently.

Figure 2E:
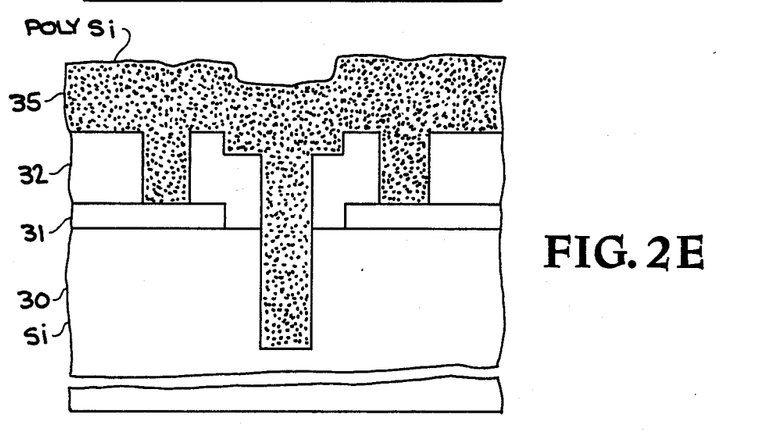
FIG. 2e is a successor cross-section to FIG. 2d after the first slot type has been filled with filler material.
Figure 2F:
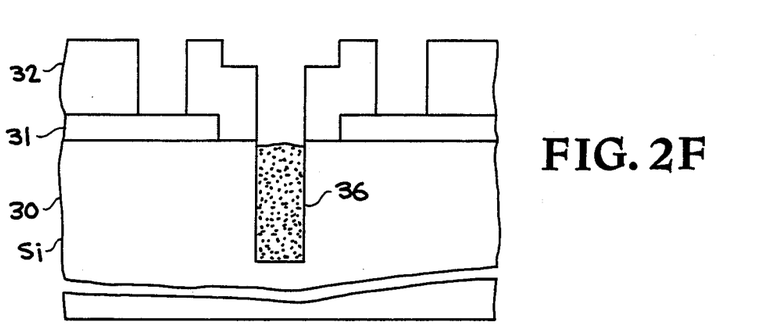
FIG. 2f is a successor cross-section to FIG. 2e after excess filler material has been removed.
Figure 2G:
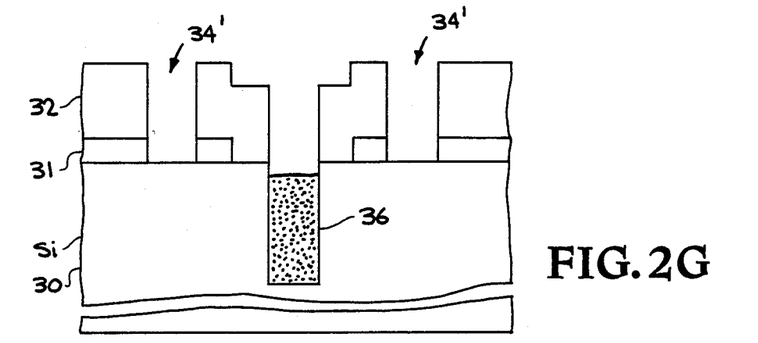
FIG. 2g is a successor cross-section to FIG. 2f after the first layer of masking material has been etched to expose the substrate where second type slots are to be formed.
Figure 2H:
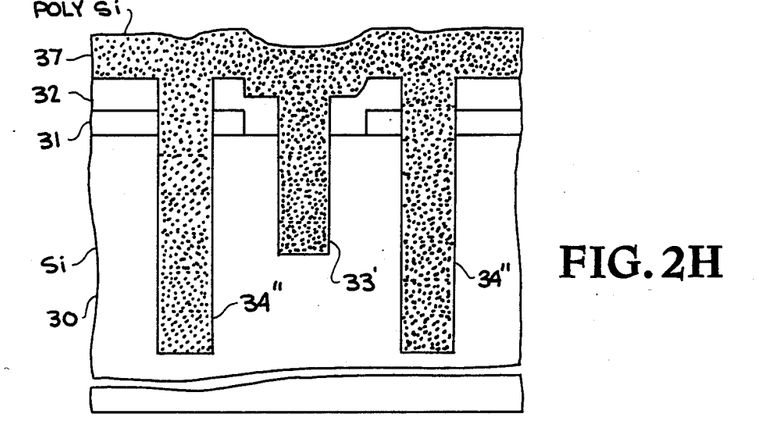
FIG. 2h is a successor cross-section to FIG. 2g after second type slots have been formed and filler material has been universally applied.
Figure 2I:
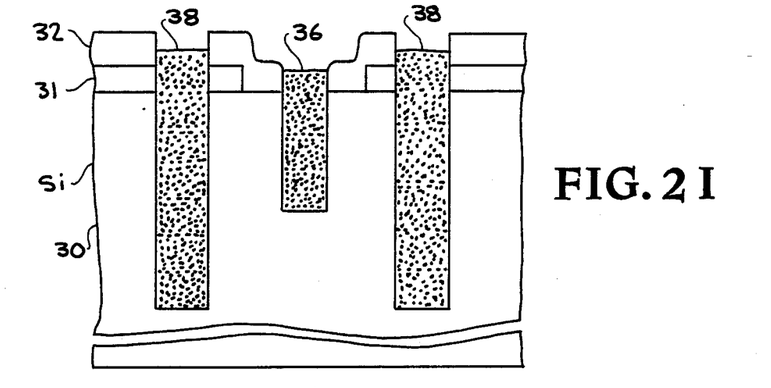
FIG. 2i is a successor cross-section to FIG. 2h after the excess filler material has been removed exposing slots of a first and second type.

Next, the second masking layer 32 is itself masked and defined to produce a latent image 33 of slots of a first type and a latent image 34 of slots of a second type. The region 33 overlies silicon substrate 30 through the opening in first layer 31 whereas regions 34 of the second slot type overlie solid portions of the masking layer 31. Thus, when an etch is used that selectively etches layer 32 in favor of layer 31, the portion of layer 32 through which a first type slot region 33 is to be formed is fully etched whereas the portion of second layer 32 at region 34 essentially stops at the layer 31. Preferably, layer 31 is also resistant to an etch which etches the silicon substrate 30 so that the slot 33' of the first type may be formed, as shown in FIG. 2d, with layer 31 serving as a stop layer to the formation of slots of the second type. After slot 33' is formed it is filled with a filler material 35 as shown in FIG. 2e. The filler material is selected from the same class of materials described above for the Oxide Step Process. As shown in FIG. 2f, the excess filler material is etched back to a height which defines plug 36 which will permanently reside in the slot region 33'. Then, as shown in FIG. 2g, an etch is used which selectively etches through layer 31 but does not significantly etch layer 32. As a result, the channels 34' over slot regions of the second type are formed down to the surface of the silicon substrate 30. By using an appropriate etch of the type set out in the articles on selective etching in the Background section, the slot regions 34" of the second type are formed, as shown in FIG. 2g. In the embodiment of the Figures the etch regions 34" of the second type are deeper than the etch region 33' of the first type. Generally, slots may have variable depths, widths and aspect ratios. Finally, the filler material 37, which may be the same or different than the other filler material forming plug 36 in the first type slot, is etched back to leave plugs 38 in slot regions 34" of the second type and plug 36 near the surface of slot region 33' of the first type, as shown in FIG. 2i. For isolating slots the filler material may be nonconducting while for active slots the filler material may be conductive. The residual portions of layer 32 and 31 may then be removed and a relatively planar surface (not shown) is exposed for subsequent processing. This surface will include veins of exposed portions of plugs 38 and plugs 36 intermixed with residual regions of semiconductor substrate 30.

The foregoing description of a preferred embodiment of the invention has been presented for purposes of illustration and description. It is not intended to be exhaustive or to limit the invention to the precise form disclosed, and obviously many modifications and variations are possible in light of the above teaching. For example, the process sequence for forming slots of different types by use of a latent image mask may be employed at various stages of the overall process of fabrication. The embodiment described in this application shows slot formation in unprocessed silicon but slots could be formed at later times in a fabrication process, i.e., after active regions have been formed. Also, two types of slots have been shown whereas more than two types may be defined in the same latent image mask. The embodiment chosen fairly explains the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A process for fabricating slots of different types in self-aligned relationship, comprising the steps of:
    applying to a semiconductor substrate a layer of a masking material in which latent images of slots of different types are to be formed;
    patterning said layer of masking material to define within said layer images for slots of at least a first type and a second type;
    etching said layer of masking material to expose the substrate where slots of said first type are to be formed;
    etching said exposed regions of said substrate to form slots of said first type;
    etching said latent image mask layer to expose the substrate where slots of said second type are to be formed; and
    etching said exposed regions of said substrate to form slots of said second type whereby said slots of said first type and of said second type are arrayed in self-aligned relationship.

2. A process for fabricating slots of different types in accordance with claim 1 wherein after said step of etching said exposed regions of said substrate to form slots of said first type, the following step is performed:
    filling said slots of said first type with a filler material.

3. A process for fabricating slots of different types in accordance with claim 2 wherein after said step of filling said slots of said first type the following steps are performed:
    removing excess filler material; and
    applying a protective layer over said filled slots of said first type.

4. A process for fabricating slots of different types in accordance with claim 1 wherein said step of etching said layer of masking material to expose the substrate where slots of said first type are to be formed is accomplished by the following steps:
    determining an etch rate in said layer of masking material for the etchant being used;
    measuring the thickness of said layer of masking material where it overlies regions where slots of said first type are to be formed; and
    etching for the time required to etch through said layer of masking material where it overlies regions where slots of said first type are to be formed.

5. A process for fabricating slots in accordance with claim 4 wherein before said step of etching said exposed region of said substrate to form slots of said second type, the following step is accomplished:
    etching for the time required to etch through said layer of masking material where it overlies regions where slots of said second type are to be formed.

6. A process for forming slots of different types in accordance with any one of claims 1-5 wherein said layer of a masking material comprises a layer of silicon dioxide.

7. A process for forming slots of different types in accordance with claim 1 wherein said step of applying said layer of masking material in which latent images of slots of different types are to be formed, the following step is performed:
    applying a second layer of a second masking material over a first layer of a first masking material, said second layer having an etch property that is different from the etch property of said first layer.

8. A process for forming slots of different types in accordance with claim 7 wherein said second layer of masking material overlies only regions where slots of said second type are to be formed and not over regions where slots of said first type are to be formed.

9. A process for fabricating slots of different types in accordance with claim 8 wherein said layer of a masking material is a layer of silicon nitride and said second layer of masking material is a layer of silicon dioxide.

10. A process for fabricating slots of different types in accordance with claim 8 wherein said layer of a masking material is a layer of silicon dioxide and said second layer of a masking material is a layer of silicon nitride.

11. A process for fabricating slots of different types in accordance with claim 7 wherein after said step of etching said exposed regions of said substrate to form slots of said first type, the following step is performed:
    filling said slots of said first type with a filler material.

12. A process for fabricating slots of different types in accordance with claim 8 wherein said step of etching said layer of masking material to expose regions of said substrate where slots of said first type are to be formed is accomplished by a step of etching said layer of masking material by an etch which selectively etches said layer of masking material preferentially over said second layer of masking material.

13. A process for fabricating slots of different types in accordance with claim 12 wherein said step of etching said layer of masking material to expose regions of said substrate where slots of said second type are to be formed is accomplished by a step of etching with an etch which selectively etches said second layer of masking material preferentially over said layer of masking material.

14. A process for forming slots of different types in accordance with claim 1 wherein before said step of applying said layer of masking material in which latent images of slots of different types are to be formed, the following step is performed:
applying a layer of another masking material, said another layer having an etch property that is different from the etch property of said first layer.

15. A process for fabricating slots of different types in self-aligned relationship at a surface of a semiconductor material substrate, said process comprising the steps of:
(a) applying a layer of a first masking material over said substrate surface;
(b) exposing a portion of said substrate surface;
(c) covering said layer of a first masking material and the otherwise exposed portion of said substrate surface with a cover layer of a second masking material;
(d) etching through said cover layer of said second masking material over said otherwise exposed portion of said substrate surface to provide a latent image mask for a slot of said first type and over said layer so as to provide a latent image mask for a slot of said second type;
(e) etching selectively the material exposed by said latent image mask for said first type of said slots so as to form said first type of slot;
(f) filling said first type of slot with a filler material;
(g) removing excess filler material;
(h) applying a protective layer over said filled slots of said first type;
(i) etching through any remaining thickness of said layer of a first masking material; and
(j) etching into any underlying material to form said second type of slot.

16. The process of claim 15 wherein said first masking material is further characterized as comprising silicon dioxide.

17. The process of claim 16 wherein said cover layer of said second masking material is further characterized as comprising silicon dioxide.

18. The process of claim 15 further comprising the step of applying an intermediate layer of a third masking material over at least a first portion of the surface of said substrate prior to the step of applying said layer of said first masking material.

19. The process of claim 18 wherein the step of etching selectively the material exposed by the latent image mask for said second type of said slots so as to form said second type of slot comprises the steps of:
(a) etching through any remaining thickness of said layer; and
(b) etching into any underlying material to form said second type of slot.

20. The process of claim 19 wherein said intermediate layer is further characterized as being provided adjacent said layer.

21. The process of claim 20 wherein said first material is characterized as being silicon dioxide and said third material as being silicon nitride.

22. A process of forming slots at the surface of semiconductor layer in the fabrication of an integrated circuit comprising the steps of:
(a) providing a first mask layer overlying a first portion of said semiconductor layer and leaving exposed a second portion of said semiconductor layer;
(b) providing a second mask layer overlying said first mask layer and said second portion of said semiconductor layer;
(c) etching away a first portion of said second mask layer so as to expose a corresponding portion of said second portion of said semiconductor layer and a second portion of said second mask layer so as to expose a corresponding portion of said first mask layer;
(d) etching away that portion of said semiconductor layer exposed by the removal of said first portion of said second mask layer so as to open a first slot;
(e) filling said first slot with a first filler material;
(f) etching away that portion of said first mask layer exposed by the removal of said second portion of said second mask layer and the subsequently exposed corresponding portion of said semiconductor layer so as to open a second slot; and
(g) filling said second slot with a second filler material.

23. The process of claim 22 wherein said first and second mask layers are further characterized as being of the same material and said second mask layer as being of generally uniform thickness.

24. The process of claim 22 wherein said first and second mask layers are further characterized as being of different materials distinguished as having differing etching characteristics so that said first mask layer acts as a stop etch layer in the etch removal of the first portion of said second mask layer.

* * * * *